(12) United States Patent
Torregrosa et al.

(10) Patent No.: US 9,534,287 B2
(45) Date of Patent: Jan. 3, 2017

(54) MACHINE FOR IMPLANTING IONS IN PLASMA IMMERSION MODE FOR A LOW-PRESSURE METHOD

(75) Inventors: Frank Torregrosa, Simiane (FR); Laurent Roux, Marseilles (FR)

(73) Assignee: ION BEAM SERVICES, Peynier (FR)

( * ) Notice: Subject to any disclaimer, the term of this patent is extended or adjusted under 35 U.S.C. 154(b) by 494 days.

(21) Appl. No.: 14/117,166

(22) PCT Filed: Jun. 7, 2012

(86) PCT No.: PCT/FR2012/000227
§ 371 (c)(1),
(2), (4) Date: Dec. 16, 2013

(87) PCT Pub. No.: WO2012/168575
PCT Pub. Date: Dec. 13, 2012

(65) Prior Publication Data
US 2014/0102370 A1 Apr. 17, 2014

(30) Foreign Application Priority Data

Jun. 9, 2011 (FR) ...................................... 11 01763

(51) Int. Cl.
*H01J 37/32* (2006.01)
*C23C 14/48* (2006.01)

(52) U.S. Cl.
CPC ........... *C23C 14/48* (2013.01); *H01J 37/3233* (2013.01); *H01J 37/32174* (2013.01);
(Continued)

(58) Field of Classification Search
CPC ................ H01J 37/32357; H01J 37/32412; H01J 37/32499; H01J 37/32706; H01J 37/32091; H01J 37/321; H01J 37/3233; C23C 14/48; C23C 14/358; C23C 14/228; C23C 14/35; C23C 8/36; H01L 21/31612; H01L 21/28
(Continued)

(56) References Cited

U.S. PATENT DOCUMENTS

| | | | | |
|---|---|---|---|---|
| 4,762,728 A | * | 8/1988 | Keyser | ................... H01L 21/28 257/E21.158 |
| 5,942,039 A | * | 8/1999 | Kholodenko | ..... H01J 37/32642 118/723 E |

(Continued)

FOREIGN PATENT DOCUMENTS

FR 2 871 934 A1 12/2005

OTHER PUBLICATIONS

International Search Report of PCT/FR2012/000227 dated May 15, 2013.

*Primary Examiner* — David A Vanore
(74) *Attorney, Agent, or Firm* — Sughrue Mion, PLLC

(57) ABSTRACT

An ion implantation machine includes an enclosure that is connected to a pump device, a negatively polarized substrate-carrier that is arranged inside the enclosure, and a plasma feed device in the form of a generally cylindrical body extending between an initial section and a terminal section, the device having a main chamber provided with an ionization cell, the main chamber being provided with a gas delivery orifice, and the final section of the main chamber being provided with a head-loss component for creating a pressure drop relative to the body. Furthermore, the plasma feed device also includes an auxiliary chamber arranged beyond the final section, the auxiliary chamber opening out into the enclosure at the terminal section.

14 Claims, 2 Drawing Sheets

(52) U.S. Cl.
CPC .. *H01J 37/32357* (2013.01); *H01J 37/32412* (2013.01); *H01J 37/32422* (2013.01); *H01J 37/32706* (2013.01)

(58) Field of Classification Search
USPC ... 118/723 R, 723 I, 719, 723 ER, 723 MW; 438/514, 516, 14, 301, 5, 585; 250/251, 250/492.3, 423 R, 424, 492.2, 281, 282, 283, 250/286, 287, 288, 336.1, 394, 396 R, 397, 250/423 F, 492.1, 492.21; 204/298.07, 298.08, 204/298.14; 257/E21.057, E21.143
See application file for complete search history.

(56) References Cited

U.S. PATENT DOCUMENTS

| | | | | |
|---|---|---|---|---|
| 6,074,488 A * | 6/2000 | Roderick | ............ | H01L 21/6833 118/723 E |
| 6,331,701 B1 * | 12/2001 | Chen | ............ | H05H 3/02 250/251 |
| 7,244,474 B2 * | 7/2007 | Hanawa | ............ | C23C 16/402 118/723 ER |
| 7,291,360 B2 * | 11/2007 | Hanawa | ............ | C23C 16/402 118/719 |
| 7,695,590 B2 * | 4/2010 | Hanawa | ............ | C23C 14/358 118/723 E |
| 7,767,561 B2 * | 8/2010 | Hanawa | ............ | C23C 14/48 257/E21.057 |
| 7,807,961 B2 * | 10/2010 | Hatem | ............ | C23C 14/48 118/723 FI |
| 7,863,582 B2 * | 1/2011 | Godyak | ............ | H01J 27/18 250/423 F |
| 8,058,156 B2 * | 11/2011 | Hanawa | ............ | C23C 14/046 257/E21.057 |
| 8,344,318 B2 * | 1/2013 | Hadidi | ............ | H01J 37/32422 250/281 |
| 8,623,171 B2 * | 1/2014 | Godet | ............ | H01J 37/32623 118/504 |
| 8,895,945 B2 * | 11/2014 | Torregrosa | ............ | H01J 37/244 250/396 R |
| 9,232,628 B2 * | 1/2016 | Radovanov | ............ | H05H 3/00 |
| 2001/0046566 A1 | 11/2001 | Chu et al. | | |
| 2002/0023831 A1 * | 2/2002 | Iwase | ............ | C23C 14/228 204/192.12 |
| 2005/0136604 A1 * | 6/2005 | Al-Bayati | ............ | H01J 37/321 438/301 |
| 2005/0211170 A1 * | 9/2005 | Hanawa | ............ | C23C 14/358 118/723 R |
| 2005/0211171 A1 * | 9/2005 | Hanawa | ............ | C23C 16/045 118/723 R |
| 2005/0211546 A1 * | 9/2005 | Hanawa | ............ | C23C 14/358 204/192.12 |
| 2006/0019477 A1 * | 1/2006 | Hanawa | ............ | C23C 14/48 438/514 |
| 2008/0315127 A1 * | 12/2008 | Torregrosa | ............ | C23C 8/36 250/492.3 |
| 2009/0289179 A1 * | 11/2009 | Chen | ............ | H01J 37/32357 250/251 |
| 2010/0084980 A1 | 4/2010 | Koo | | |
| 2013/0153779 A1 * | 6/2013 | Torregrosa | ............ | H01J 37/244 250/394 |
| 2013/0287963 A1 * | 10/2013 | Radovanov | ............ | C23C 14/48 427/523 |
| 2013/0305988 A1 * | 11/2013 | DiVergilio | ............ | H01J 37/32091 118/723 MP |
| 2014/0102370 A1 * | 4/2014 | Torregrosa | ............ | C23C 14/48 118/723 VE |
| 2016/0064260 A1 * | 3/2016 | Berry, III | ............ | H01L 21/67069 438/712 |

* cited by examiner

MACHINE FOR IMPLANTING IONS IN PLASMA IMMERSION MODE FOR A LOW-PRESSURE METHOD

CROSS REFERENCE TO RELATED APPLICATIONS

This is a National Stage of International Application No. PCT/FR2012/000227 filed Jun. 7, 2012, claiming priority based on French Patent Application No. 1101763 filed Jun. 9, 2011, the contents of all of which are incorporated herein by reference in their entirety.

The present invention relates to a machine for implanting ions in plasma immersion mode for a low-pressure method.

The field of the invention is that of ion implantation machines that make use of a plasma, in other words ion implanters operating in plasma immersion mode.

Thus, implanting ions in a substrate consists in immersing the substrate in a plasma and in biasing it with a negative voltage of a few tens of volts (V) to a few tens of kilovolts (kV) (generally less than 100 kV), in order to create an electric field capable of accelerating the ions of the plasma towards the substrate.

The penetration depth of the ions is determined by their acceleration energy. It depends firstly on the voltage applied to the substrate and secondly on the respective natures of the ions and of the substrate.

For reasons associated with physics, igniting and maintaining plasmas requires a pressure that is relatively high, commonly $10^{-3}$ millibars (mbar) to $10^{-1}$ mbar. This high pressure gives rise to undesirable secondary effects. The substrate is the seat of unwanted redeposition and etching. Furthermore, gas consumption depends directly on the working pressure.

Attempts have therefore been made to reduce this pressure to as low as possible. Nevertheless, such pressure reduction leads to difficulties in igniting the plasma and to a significant reduction in its density.

Nowadays, it is accepted that the optimum working pressure depends on the type of ionization source that generates and maintains the plasma:
  microwave sources: $10^{-2}$ mbar to $10^{-1}$ mbar; and
  radiofrequency sources: $10^{-3}$ mbar to $10^{-1}$ mbar.

Thermal sources (sources with filaments) make it possible to reduce pressure, but they give rise to contamination by vaporization.

Discharge sources also make it possible to work at lower pressure, but that is to the detriment of plasma density.

Thus, document US 2001/0046566 describes a machine for implanting ions in plasma immersion mode that comprises:
  an enclosure that is connected to a pump device;
  a negatively biased substrate-carrier that is arranged in the enclosure; and
  a plasma feed device having a chamber provided with an ionization cell, the chamber being in the form of a generally cylindrical body that extends between an initial section and a terminal section opening out into the enclosure;
  the chamber being provided with a gas delivery orifice; and
  the terminal section presenting a head loss relative to the body.

That implantation machine makes it possible to generate a plasma at relatively high pressure, with a significant reduction in the above-mentioned secondary effects.

Nevertheless, firstly, the grid that creates the head loss is optimized for electromagnetic considerations and not from the point of view of the head loss that it generates.

Secondly, that grid must be conductive and it is therefore made of a metallic material, and that can lead to the plasma being polluted. The grid becomes etched in contact with the plasma (chemical and ionic etching). The metallic contamination that results from this etching is incompatible with certain fields of application such as microelectronics. Furthermore, the unwanted deposition phenomena that take place on the walls that are in contact with the plasma, i.e. the walls of the chamber, are significant.

Thirdly, the metal grid seeks to block the electromagnetic field for igniting the plasma in order to confine it in the chamber and prevent it from propagating into the enclosure where only the ions are accelerated. The electrostatic field for accelerating the ions is created between the substrate and the grid and it imposes the trajectory followed by the ions, thereby preventing so-called "conformal" three-dimensional implantation of the kind that can be obtained by means of a Child Langmuir sheath when the plasma is present around the substrate.

Fourthly, the chamber opens out directly into the enclosure, and that likewise is unfavorable to the propagation of the plasma in the enclosure.

An object of the present invention is thus to improve that situation.

According to the invention, an ion implantation machine comprises:
  an enclosure that is connected to a pump device;
  a negatively polarized substrate-carrier that is arranged inside the enclosure; and
  a plasma feed device in the form of a generally cylindrical body extending between an initial section and a terminal section, the device having a main chamber provided with an ionization cell;
  the main chamber being provided with a gas delivery orifice; and
  the final section of the main chamber being provided with head-loss means for creating a pressure drop relative to the body;
  furthermore, the plasma feed device also includes an auxiliary chamber arranged beyond the final section, said auxiliary chamber opening out into said enclosure at said terminal section.

Preferably, said auxiliary chamber is provided with a second ionization cell.

Advantageously, the plasma feed device presents a volume that is smaller than the volume of the enclosure.

In a first embodiment, the final section is in the form of a partition pierced by a plurality of holes.

In a second embodiment, the final section presents an opening of area that is small relative to the area of any of the sections of the body lying between the initial section and the terminal section.

According to an additional characteristic of the invention, the first ionization cell has an excitation coil and a confinement coil.

It is desirable for the axis of the substrate-carrier and the axis of said plasma feed device to be two distinct axes.

Under such circumstances, the substrate-carrier and the plasma feed device present an offset that is preferably adjustable.

According to another advantage of the invention, the final section is removable.

Optionally, the machine includes at least one additional plasma feed device.

Advantageously, the machine comprises:
- a voltage source having its positive pole connected to ground;
- a capacitor connected in parallel with said voltage source; and
- a switch connected between the negative pole of the voltage source and said substrate-carrier turntable.

Furthermore, the substrate-carrier turntable is movable in rotation about its axis.

Also, the substrate-carrier turntable is disk-shaped and the distance between said substrate-carrier turntable and said plasma feed device is greater than the diameter of said substrate-carrier.

Preferably, the head-loss means are electrically insulating.

The present invention appears below in greater detail from the following description of embodiments given by way of illustration and with reference to the accompanying figures, in which.

Figure 2A:
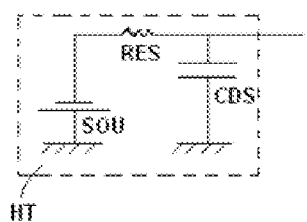
FIG. 2 shows a circuit for biasing the substrate-carrier turntable, and more particularly.

FIG. 2*a* shows a first embodiment of this circuit; and

Figure 2B:
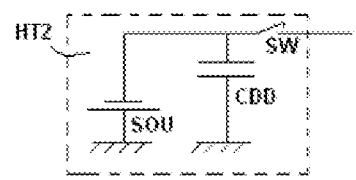

FIG. 2*b* shows a second embodiment of this circuit; and

Figure 3:
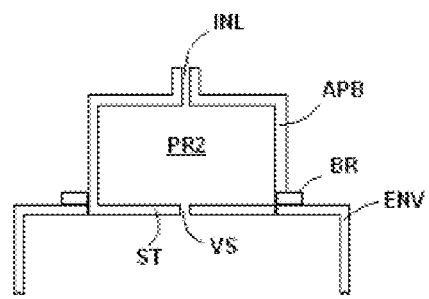

FIG. 3 is a diagram in section of a second embodiment of the plasma feed device.

Elements that are present in more than one of the figures are given the same references in each of them.

Figure 1:
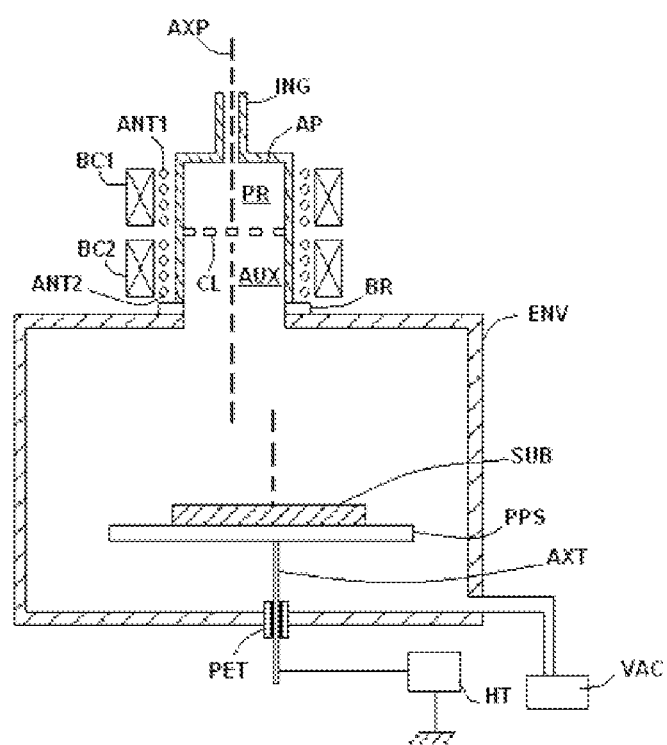
FIG. 1 is a diagram in section of an ion implantation machine.

As shown in FIG. 1, a vacuum enclosure ENV represents an ion implantation machine. In microelectronic applications, it is recommended to use an enclosure that is made of aluminum alloy in order to limit contamination with metallic elements such as iron, chromium, nickel, or cobalt. It is also possible to use a coating of silicon or of silicon carbide.

Pump means VAC are arranged below the enclosure ENV.

A substrate-carrier turntable PPS is in the form of a horizontal disk that is movable about a vertical axis AXT, and it receives the substrate SUB that is to be subjected to ion implantation. It is connected to a high voltage electrical power supply HT via a high voltage electrical bushing PET, this power supply also being connected to ground. The negative potential applied to the substrate-carrier generally lies in the range a few tens of volts to a few tens of kilovolts.

Conventionally, the power supply may consist in a simple direct current (DC) source having its positive pole connected to ground. Nevertheless, the invention is applicable regardless of the means used for applying negative bias to the substrate in the context of implantation in plasma immersion mode, and regardless of whether the bias is constant or variable. The substrate, particularly if it is insulating, tends to become positively charged.

With reference to FIG. 2*a*, a first embodiment of the power supply HT serves to limit the charge effect. It comprises a DC voltage source SOU having its positive pole connected to ground. A branch connection that is connected in parallel with the source is formed by a capacitor CDS in series with a resistor RES, the resistor being connected to the negative pole of the source SOU. The substrate-carrier turntable PPS is connected to the common point between the capacitor CDS and the resistor RES.

The capacitor CDS presents capacitance of low value so as to cause the potential of the substrate to return progressively to a value that is close to zero during its discharging stage.

Even though using a pulsed plasma makes it possible to limit the charge effect, the problem remains, particularly if the potential of the substrate remains very negative during the method (when using a high-capacitance capacitor).

When using a low-capacitance capacitor, together with a plasma pulse of sufficient length, the following phenomenon occurs:
- at the beginning of the pulse, the capacitor is charged, the potential of the substrate is set by the charging voltage, and ions are accelerated towards the substrate by the above-described mechanism;
- the voltage across the terminals of the capacitor drops because the capacitor discharges into the plasma; and
- above a certain potential, referred to herein as the inversion potential, the positive charge that has accumulated on the insulating zones generate an electric field that becomes predominant and that attracts the electrons of the plasma; the positive charges are thus neutralized and the risk of arcing is eliminated.

This neutralization is particularly effective when the working pressure is low. If the mean free path of electrons is large, then the electron stream that reaches the surface for neutralizing the charge effect is also considerable.

The conditions needed to set up this mechanisms are therefore as follows:
- capacitance of the capacitor CDS sufficiently small;
- duration of the plasma pulse sufficiently long to reach the inversion potential before the accumulated charge on the surface gives rise to arcing; and
- working pressure sufficiently low for the mean free path of electrons created by the plasma source to enable them to reach the substrate without risking collision and recombination with the gas molecules and ions present inside the enclosure.

The function of the resistor RES is to limit the current when the capacitor CDS begins to charge. Furthermore, if this resistor presents resistance greater than the equivalent impedance of the plasma, it also serves to limit recharging of the capacitor during the plasma pulse that it is desired to discharge.

For a typical plasma impedance equal to 100 kilo-ohms (kΩ) the load resistance preferably lies in the range 200 kΩ to 2000 kΩ. The capacitance of the capacitor CDS is such that it has discharged almost completely at the end of the plasma pulse.

The parameters commonly used in this mode are as follows:
- plasma density lying in the range $10^8$ per cubic centimeter ($cm^3$) to $10^{10}/cm^3$;
- plasma pulse duration lying in the range 15 microseconds (µs) to 500 µs;
- pulse repetition rate lying in the range 1 hertz (Hz) to 3 kilohertz (kHz);
- working pressure lying in the range $2\times10^{-4}$ mbar to $5\times10^{-3}$ mbar;
- gas used: $N_2$, $BF_3$, $O_2$, $H_2$, $PH_3$, $AsH_3$, or Ar;
- resistance of resistor RES greater than 300 kΩ;
- capacitance of capacitor CDS 500 picofarads (pF); and
- bias voltage lying in the range −100 V to −10,000 V.

With reference to FIG. 2*b*, a second embodiment of the power supply HT2 also enables the charge effect to be limited. This power supply comprises a DC voltage source SOU having its positive pole connected to ground. A capacitor CDD is connected in parallel with the source. A switch SW is connected between the negative pole of the source SOU and the substrate-carrier turntable PPS. The switch SW is made of metal oxide semiconductor (MOS) technology, or of insulated gate bipolar transistor (IGBT) technology.

When the switch SW is opened, the capacitor CDD charges progressively at the nominal voltage of the source SOU.

When the switch SW is closed while the plasma is on, current is drawn due to the equivalent capacitance of the machine and to the capacitance of the plasma sheath. The equivalent capacitance of the machine is the capacitance of all of the elements making it up, in particular the cables, the electrical bushings, the isolating transformers, and the capacitance that is formed between the substrate-carrier and the enclosure.

The switch SW typically remains closed for 5 μs to 100 μs, during which stage implantation occurs since positive ions are attracted towards the substrate, which is negatively biased.

The capacitor has large capacitance (typically lying in the range 300 nanofarads (nF) to 1.5 microfarads (μF)), such that the voltage across its terminals does not drop during implantation.

After the implantation stage, the switch SW is opened and the source SOU once more charges the capacitor CDD.

During this time, the equivalent capacitance of the machine discharges completely into the plasma and the substrate returns to a floating potential. As a result, electrons in the plasma neutralize the insulating zones of the substrate that had become positively charged during implantation.

The neutralization stage during which the switch SW remains open typically lasts for 1 μs to 80 μs.

Once the neutralization stage is over, the plasma may be extinguished during an extinction stage, thereby presenting the advantage of reducing plasma/surface interactions, of reducing the thermal budget, and of minimizing particle creation. This extinction stage typically lasts for 20 μs to 200 μs, during which stage the switch SW remains open. It is then possible to repeat the above-described cycle:
  implantation stage;
  neutralization stage; and
  extinction stage.

The neutralization stage may be shortened by accelerating the discharging of the equivalent capacitance of the machine by means of a second switch arranged between the substrate-carrier turntable PPS and ground. This second switch is closed during the neutralization stage and during the extinction stage; it is open during the implantation stage.

Returning to FIG. 1, the top portion of the enclosure ENV receives the plasma feed device AP. This device is in the form of a generally cylindrical body of vertical axis AXP that extends between an initial section (at the top in the figure) and a terminal section (at the bottom in the figure). A coupling flange BR enables the terminal section of the device AP on the vacuum enclosure ENV. The initial section has a delivery orifice ING for inserting the gas that gives rise to the plasma. This delivery orifice ING is centered on the vertical axis AXP. The vertical axis AXP intersects the surface of the substrate-carrier turntable PPS.

The plasma feed device AP is preferably made of silica glass (commonly mis-named quartz) or of alumina in order to limit contamination problems. Head-loss means for creating a pressure drop are provided, and in this embodiment they are constituted by a partition CL pierced by a plurality of through holes. The partition CL is advantageously electrically insulating, preferably being made of silica glass, and it is arranged between the initial section and the terminal section of the device AP. By way of example, for a cylindrical body having a diameter of about 15 centimeters (cm) the holes in the partition CL have a diameter of the order of a few millimeters (mm). In order to facilitate maintenance operations, the partition CL is removable.

The space defined by the partition CL and the initial section defines a main chamber PR. The partition CL thus marks the final section of the main chamber. The main chamber PR is surrounded externally by an ionization cell that comprises firstly a radiofrequency antenna ANT1, and secondly, if need be, a confinement coil BC1. In this embodiment, the antenna ANT1 is constituted by a few turns of an electrical conductor, e.g. a tube or a strip of copper.

Naturally, it is possible to use any type of plasma source: a discharge source, an inductively coupled plasma (ICP) source, a helicon, a microwave source, or an arc. These sources must be capable of operating at pressure levels that are low enough for the electric field created between the turntable PPS and the grounded enclosure ENV not to give rise to a discharge plasma being ignited.

The head loss between the body of the plasma feed device AP and the enclosure ENV makes it possible to establish a pressure difference between the two elements, which difference lies in the range one to two orders of magnitude.

The space defined by the partition CL and the terminal section defines an auxiliary chamber AUX.

Optionally, the auxiliary chamber AUX is also externally surrounded by a second ionization cell that comprises firstly a confinement coil BC2 and secondly a radiofrequency antenna ANT2.

It is also possible to provide a single confinement coil and a single antenna covering both of the chambers PR and AUX of the device AP.

Any plasma-generating species may be implanted. It is possible to start from a gaseous precursor such as $N_2$, $O_2$, $H_2$, He, Xe, Ar, $BF_3$, $B_2H_6$, $AsH_3$, $PH_3$, $SiH_4$, $GeH_4$, $C_2H_4$, $SiF_4$, $GeF_4$, $AsF_5$, $CHF_3$, $SF_6$, $PF_5$.

Such an arrangement makes it possible to decrease very considerably the phenomena that interfere with deposition and etching.

Typical parameters for the plasma without implementing the invention are as follows:
  gas flow rate: 10 standard cubic centimeters per minute (sccm) to 500 sccm under standard pressure and temperature conditions;
  pressure inside the vacuum enclosure $10^{-3}$ mbar to $10^{-1}$ mbar; and
  plasma density $10^9/cm^3$ to $10^{11}/cm^3$.

The invention improves this situation considerably since it makes it possible to obtain the following values:
  gas flow rate: 0.5 sccm to 50 sccm;
  pressure inside the vacuum enclosure: of the order of $10^{-4}$ mbar to $10^{-2}$ mbar; and
  plasma density $10^9/cm^3$ to $10^{11}/cm^3$.

These results are obtained by the partition CL that introduces considerable head loss between the location where the plasma is generated, i.e. the main chamber PR, and the location where the plasma is used. It is thus possible to conserve a pressure of the order of $10^{-3}$ mbar to $10^{-1}$ mbar in the main chamber while reducing this pressure significantly in the vacuum enclosure ENV. The pressure that exists in the main chamber makes it easy to ignite the plasma. The electrons of the plasma are then capable, under the effect of electrostatic fields applied by the ionization cell, of reaching the vacuum enclosure ENV through the partition CL and of causing the plasma to ignite and to propagate therein.

This head loss constitutes the essence of the invention. It may be implemented in many ways.

With reference to FIG. 3, there can be seen a second embodiment of the plasma feed device given by way of indication.

The plasma feed device APB is still in the form of a generally cylindrical body that extends between an initial section and a terminal section. The coupling flange BR still has the same function, namely that of fastening the terminal section of the device APB to the vacuum enclosure. As above, the initial section is provided with a delivery orifice INL into which the gas is inserted. In contrast, head loss is not obtained by means of a pierced partition. In this embodiment, the body of the device APB constitutes the main chamber PR2. There is no longer an auxiliary chamber, and it is the terminal section ST itself that presents an opening VS of area that is very small compared with the area of the middle section of the device APB.

Returning to FIG. 1, an additional characteristic of the implanter 1 enables implantation to be made more uniform for a substrate of large size.

As mentioned above, the substrate SUB rests on a substrate-carrier turntable PPS that is generally in the shape of a disk and that is movable about its vertical axis AXT. With or without rotation, if the axis AXP of the plasma feed device ALP that is vertically above the substrate SUB is close to the axis AXT of the turntable PPS, then plasma diffusion is maximized along this axis and presents a distribution gradient relative to said axis. The dose implanted in the substrate SUB therefore presents a distribution that is not uniform.

If the two axes AXT and AXP are offset, then turning the substrate-carrier turntable PPS enables the substrate SUB to be moved relative to the axis AXP of the plasma source. The dose implanted in the substrate SUB then presents a distribution of uniformity that is significantly improved.

The effectiveness of this system has been verified on silicon wafers having a diameter of 300 mm for which the resulting non-uniformity was found to be less than 1% for implanting $BF_3$ at 500 electron volts (eV) and at $10^{15}$ per square centimeter ($cm^2$).

Furthermore, the distance between the substrate-carrier turntable PPS and the plasma feed device AP is preferably greater than the diameter of the substrate-carrier in the general case where it is disk-shaped.

Naturally, the present invention enables a variety of plasma feed devices to be implemented such as those described above, the devices then being on the enclosure ENV around the vertical axis AXT of the substrate-carrier turntable PPS.

The plasma feed device is described above as being a component attached to a vacuum enclosure. The invention naturally also applies if the device forms an integral portion of the enclosure.

The embodiments of the invention described above are selected because of their concrete nature. Nevertheless, it is not possible to list exhaustively all embodiments covered by the invention. In particular, any of the means described may be replaced by equivalent means without going beyond the ambit of the present invention.

The invention claimed is:

1. An ion implantation machine comprising:
    an enclosure (ENV) that is connected to a pump device (VAC);
    a negatively polarized (HT) substrate-carrier (PPS) that is arranged inside said enclosure (ENV); and
    a plasma feed device (AP) in the form of a generally cylindrical body extending between an initial section and a terminal section, the device having a main chamber (PR, PR2) provided with an ionization cell (BC1, ANT1);
    said main chamber (PR, PR2) being provided with a gas delivery orifice (ING, INL); and
    the final section (CL) of said main chamber being provided with head-loss means for creating a pressure drop relative to said body (AP);
    the machine being characterized in that said plasma feed device (AP) also includes an auxiliary chamber (AUX) arranged beyond said final section, said auxiliary chamber opening out into said enclosure (ENV) at said terminal section.

2. A machine according to claim 1, characterized in that said auxiliary chamber (AUX) is provided with a second ionization cell (BC2, ANT2).

3. A machine according to claim 1, characterized in that said plasma feed device (AP) presents a volume that is smaller than the volume of said enclosure (ENV).

4. A machine according to claim 1, characterized in that said final section is in the form of a partition (CL) pierced by a plurality of holes.

5. A machine according to claim 1, characterized in that said final section (ST) presents an opening (VS) of area that is small relative to the area of any of the sections of said body (APB) lying between said initial section and said terminal section.

6. A machine according to claim 1, characterized in that said first ionization cell has an excitation coil (ANT1) and a confinement coil (BC1).

7. A machine according to claim 1, characterized in that the axis (AXT) of said substrate-carrier (PPS) and the axis (AXP) of said plasma feed device (AP) are two distinct axes.

8. A machine according to claim 7, characterized in that said substrate-carrier (PPS) and said plasma feed device (AP) present an adjustable offset.

9. A machine according to claim 1, characterized in that said final section is removable.

10. A machine according to claim 1, characterized in that it includes at least one additional plasma feed device.

11. A machine according to claim 1, characterized in that it comprises:
    a voltage source (SOU) having its positive pole connected to ground;
    a capacitor (CDD) connected in parallel with said voltage source (SOU); and
    a switch (SW) connected between the negative pole of said voltage source (SOU) and said substrate-carrier turntable (PPS).

12. A machine according to claim 1, characterized in that said substrate-carrier turntable (PPS) is movable in rotation about its axis (AXT).

13. A machine according to claim 1, characterized in that said substrate-carrier turntable (PPS) is disk-shaped and the distance between said substrate-carrier turntable and said plasma feed device (AP) is greater than the diameter of said substrate-carrier.

14. A machine according to claim 1, characterized in that said head-loss means (CL, VS) are electrically insulating.

* * * * *